(12) United States Patent
Kurachi et al.

(10) Patent No.: US 8,994,251 B2
(45) Date of Patent: Mar. 31, 2015

(54) PIEZOELECTRIC DEVICE HAVING FIRST AND SECOND NON-METAL ELECTROCONDUCTIVE INTERMEDIATE FILMS

(75) Inventors: Katsuyuki Kurachi, Tokyo (JP); Yasuhiro Aida, Tokyo (JP); Hitoshi Sakuma, Tokyo (JP); Kazuhiko Maejima, Tokyo (JP)

(73) Assignee: TDK Corporation, Tokyo (JP)

( * ) Notice: Subject to any disclaimer, the term of this patent is extended or adjusted under 35 U.S.C. 154(b) by 329 days.

(21) Appl. No.: 13/566,468

(22) Filed: Aug. 3, 2012

(65) Prior Publication Data
US 2014/0035439 A1 Feb. 6, 2014

(51) Int. Cl.
*H01L 41/047* (2006.01)

(52) U.S. Cl.
CPC ........ *H01L 41/0478* (2013.01); *H01L 41/0477* (2013.01)
USPC .......................................... 310/364; 310/328

(58) Field of Classification Search
CPC . H01L 41/047; H01L 41/0477; H01L 41/083; H01L 41/0478
USPC ....................................................... 310/364
See application file for complete search history.

(56) References Cited

U.S. PATENT DOCUMENTS

| | | | |
|---|---|---|---|
| 4,523,122 A | 6/1985 | Tone et al. | |
| 4,571,520 A | 2/1986 | Saito et al. | |
| 5,404,067 A | 4/1995 | Stein et al. | |
| 5,458,986 A | 10/1995 | Wilber et al. | |
| 7,901,800 B2 | 3/2011 | Shibata et al. | |
| 7,965,021 B2* | 6/2011 | Harigai et al. | 310/358 |
| 8,102,100 B2* | 1/2012 | Hamada et al. | 310/358 |
| 2004/0014326 A1* | 1/2004 | Din | 438/719 |
| 2005/0070043 A1* | 3/2005 | Yamakawa et al. | 438/54 |
| 2005/0098816 A1 | 5/2005 | Baniecki et al. | |
| 2005/0184627 A1 | 8/2005 | Sano et al. | |

(Continued)

FOREIGN PATENT DOCUMENTS

| | | |
|---|---|---|
| EP | 2-086-031 A2 | 8/2009 |
| JP | A-60-134617 | 7/1985 |

(Continued)

OTHER PUBLICATIONS

Yamadera, Hideya, "Measurement and Control of Thermal Stress in Thin Films," *R&D Review of Toyota CRDL*, vol. 34, No. 1, 1999, pp. 19-24 (with abstract).

(Continued)

*Primary Examiner* — J. San Martin
(74) *Attorney, Agent, or Firm* — Oliff PLC

(57) ABSTRACT

A piezoelectric device according to the present invention is provided with a first electrode film, a first nonmetal electroconductive intermediate film provided on the first electrode film, a piezoelectric film provided on the first nonmetal electroconductive intermediate film, a second nonmetal electroconductive intermediate film provided on the piezoelectric film, and a second electrode film provided on the second nonmetal electroconductive intermediate film. A linear expansion coefficient of the first nonmetal electroconductive intermediate film is larger than those of the first electrode film and the piezoelectric film, and a linear expansion coefficient of the second nonmetal electroconductive intermediate film is larger than those of the second electrode film and the piezoelectric film.

4 Claims, 6 Drawing Sheets

(56) References Cited

U.S. PATENT DOCUMENTS

| | | | |
|---|---|---|---|
| 2006/0138906 A1* | 6/2006 | Iwashita et al. | 310/358 |
| 2006/0214542 A1* | 9/2006 | Iwashita et al. | 310/364 |
| 2008/0074005 A1 | 3/2008 | Sano et al. | |
| 2008/0203855 A1 | 8/2008 | Viehland et al. | |
| 2008/0248324 A1 | 10/2008 | Murayama et al. | |
| 2009/0033177 A1 | 2/2009 | Itaya et al. | |
| 2009/0075066 A1 | 3/2009 | Shibata et al. | |
| 2010/0097723 A1 | 4/2010 | Hata et al. | |
| 2010/0117493 A1 | 5/2010 | Hayashi et al. | |
| 2011/0062825 A1 | 3/2011 | Kawahara | |
| 2011/0109701 A1 | 5/2011 | Ohashi | |
| 2012/0032300 A1 | 2/2012 | Wang | |
| 2012/0206019 A1* | 8/2012 | Noda et al. | 310/346 |
| 2013/0070029 A1* | 3/2013 | Mizukami et al. | 347/68 |
| 2013/0147880 A1* | 6/2013 | Hamada et al. | 347/68 |
| 2013/0250007 A1* | 9/2013 | Ishimori et al. | 347/70 |
| 2013/0320813 A1* | 12/2013 | Kurachi et al. | 310/360 |
| 2013/0320814 A1 | 12/2013 | Sakuma et al. | |
| 2014/0035440 A1* | 2/2014 | Aida et al. | 310/365 |

FOREIGN PATENT DOCUMENTS

| | | |
|---|---|---|
| JP | A-11-97755 | 4/1999 |
| JP | A-2000-41298 | 2/2000 |
| JP | A-2003-176176 | 6/2003 |
| JP | A-2006-100622 | 4/2006 |
| JP | A-2006-188414 | 7/2006 |
| JP | A-2006-286911 | 10/2006 |
| JP | A-2007-277606 | 10/2007 |
| JP | B2-4142128 | 6/2008 |
| JP | A-2008-211385 | 9/2008 |
| JP | A-2009-94449 | 4/2009 |
| JP | A-2010-103194 | 5/2010 |

OTHER PUBLICATIONS

U.S. Appl. No. 13/487,563, filed Jun. 4, 2012.
Feb. 21, 2014 Office Action issued in U.S. Appl. No. 13/487,530.
U.S. Appl. No. 13/487,530, filed Jun. 4, 2012.
May 14, 2013 Written Opinion of the International Searching Authority issued in International Application No. PCT/JP2013/063877.
May 14, 2013 International Search Report issued in International Application No. PCT/JP2013/063877.
Nov. 25, 2014 Office Action issued in U.S. Appl. No. 13/563,169.

* cited by examiner

PRIOR ART

PIEZOELECTRIC DEVICE HAVING FIRST AND SECOND NON-METAL ELECTROCONDUCTIVE INTERMEDIATE FILMS

BACKGROUND OF THE INVENTION

1. Field of the Invention

The present invention relates to a piezoelectric device using a piezoelectric material.

2. Related Background Art

Recently, practical application of piezoelectric devices using thin film piezoelectric materials is spreading, in place of bulk piezoelectric materials. Examples of such application include gyro sensors, shock sensors, microphones, etc. making use of the piezoelectric effect to convert a force exerted on a piezoelectric film to a voltage, or actuators, ink jet heads, speakers, buzzers, resonators, etc. making use of the inverse piezoelectric effect to deform a piezoelectric film with application of voltage thereto.

Reduction in thickness of the piezoelectric material will enable reduction in scale of the piezoelectric device to expand fields of application. Since a large number of piezoelectric devices can be manufactured together on a substrate, mass productivity must increase. Furthermore, there are many advantages in terms of performance, e.g., improvement in sensitivity when the piezoelectric film is used in a sensor. However, external stress from other films to the piezoelectric film and internal stress of the piezoelectric film itself will bring about more influence on the piezoelectric characteristics than in the case of the bulk materials, and for this reason the piezoelectric thin film requires a stress control technology different from that for the bulk materials. Therefore, a control method of the piezoelectric characteristics with focus on control of thermal stress applied to interfaces of the piezoelectric film becomes an important factor in design of the piezoelectric device.

CITATION LIST

Patent Literatures

Patent Literature 1: Japanese Patent Application Laid-open No. 2003-176176
Patent Literature 2: Japanese Patent Application Laid-open No. 2006-188414
Patent Literature 3: Japanese Patent Application Laid-open No. 1999-097755
Patent Literature 4: Japanese Patent No. 4142128
Patent Literature 5: Japanese Patent Application Laid-open No. 2009-094449

Non Patent Literature

Non Patent Literature 1: R&D Review of Toyota CRDL Vol. 34 No. 1 pp 19-24 (1999)

SUMMARY OF THE INVENTION

One of important factors among the piezoelectric characteristics is the coercive electric field Ec. The coercive electric field Ec is the magnitude of an electric field at reverse points of spontaneous polarization, and the polarization direction starts to reverse when an electric field over this coercive electric field is applied to the piezoelectric material. FIG. 1 shows a hysteresis curve of polarization P-electric field E of a typical piezoelectric device, and positions of coercive electric field Ec. In the case of a device making use of the reverse piezoelectric effect, i.e., deformation of the piezoelectric film with application of voltage, high displacement is achieved in the same direction as the polarization direction.

FIG. 2 shows a relation of strain x and electric field E of a typical piezoelectric device (which is called a butterfly curve). It is seen from FIG. 2 that the strain direction reverses at points of coercive electric field Ec. This means that even if the electric field E is increased in order to obtain a large strain x, the polarization direction will reverse just over the coercive electric field Ec, so as to result in failure in obtaining the strain x in a desired direction. Therefore, there are desires for a piezoelectric device with a large coercive electric field Ec to obtain a large strain x.

One of techniques to increase the coercive electric field is to change the composition of the piezoelectric film (Patent Literatures 1 and 2), but even in the case of the piezoelectric material of the same composition, when it is formed as a thin film, as described above, the coercive electric field changes significantly because of the external stress due to the film configuration of the device, the internal stress due to film forming conditions, and factors such as crystallinity and orientation of the piezoelectric film, and the control thereof is difficult. When the coercive electric field is increased by the change in the composition of the piezoelectric film itself, the piezoelectric constants of the piezoelectric film tend to decrease, and it is thus difficult to obtain a desired displacement.

There is another technique to efficiently drive the piezoelectric film with a small coercive electric field (Patent Literature 3), but it requires preliminary measurement of accurate values of the coercive electric field, which makes a drive circuit complicated and which increases the cost of the device.

Patent Literature 4 discloses a lamination in which a dielectric film is formed on a silicon substrate and in which an electroconductive intermediate film is laid on the dielectric film to prevent reduction of spontaneous polarization, but the effect of improvement in piezoelectric characteristics is limited just by depositing the intermediate film on only one side of the dielectric film.

Patent Literature 5 discloses the piezoelectric device in a structure in which an intermediate film to produce stress in compressive directions in the piezoelectric film is provided between an electrode formed on a silicon substrate and the piezoelectric film, though the purpose thereof is different from that of the present invention. However, there are no restrictions of the linear expansion coefficient and others on the intermediate film, and when the intermediate film is deposited just on only one side of the piezoelectric film, many piezoelectric materials fail to achieve a satisfactory inverse piezoelectric characteristic as a piezoelectric device.

The present invention has been accomplished in view of the problems of the above-described conventional technologies, and it is an object of the present invention to provide a piezoelectric device capable of readily increasing the coercive electric field of the piezoelectric device.

A piezoelectric device according to the present invention comprises a first electrode film; a first nonmetal electroconductive intermediate film provided on the first electrode film; a piezoelectric film provided on the first nonmetal electroconductive intermediate film; a second nonmetal electroconductive intermediate film provided on the piezoelectric film; and a second electrode film provided on the second nonmetal electroconductive intermediate film. A linear expansion coefficient of the first nonmetal electroconductive intermediate film is larger than a linear expansion coefficient of the first electrode film and a linear expansion coefficient of the piezoelectric film, and a linear expansion coefficient of the second nonmetal electroconductive intermediate film is larger than a linear expansion coefficient of the second electrode film and the linear expansion coefficient of the piezoelectric film.

According to the present invention, the device comprises the nonmetal electroconductive intermediate films, which facilitates introduction of compressive stress to the piezoelectric film, thereby achieving increase in coercive electric field. The specific resistance (resistivity) of each nonmetal electroconductive intermediate film can be not more than 0.1 Ωcm.

In the piezoelectric device according to the present invention, the first and second nonmetal electroconductive intermediate films can be in direct contact with the piezoelectric film.

This configuration makes it easier to further effectively introduce the compressive stress to the piezoelectric film and thus facilitates further increase in coercive electric field of the piezoelectric device.

The piezoelectric device according to the present invention can be configured as follows: there is no substrate 10 μm or more thick on a top surface of the second electrode film and there is no substrate 10 μm or more thick on a bottom surface of the first electrode film, either.

Without such substrates, there are no restraints on the piezoelectric film from the substrates and thus greater compressive stress can be exerted on the piezoelectric film.

The first and second nonmetal electroconductive intermediate films can be inorganic oxide films respectively. It is easier to make the inorganic oxide films of materials with a larger linear expansion coefficient than the piezoelectric film, and thus it is easier to exert the compressive stress on the piezoelectric film, by depositing the two inorganic oxide films at high temperature and thereafter cooling them. When the inorganic oxide films are used as the electroconductive intermediate films, it becomes feasible to deposit the electroconductive intermediate film on the piezoelectric film at high temperature or to anneal the electroconductive intermediate films, which enables greater compressive stress to be exerted on the piezoelectric film. This enables introduction of compressive stress to the piezoelectric film by heating and cooling during annealing the electroconductive intermediate films, in addition to thermal expansion of the electroconductive intermediate films, so as to enhance the effect of increase in coercive electric field.

The two inorganic oxide films can have the same composition. Furthermore, the two electroconductive intermediate films can have respective thicknesses approximately equal to each other. This configuration allows uniform compressive stresses to be exerted on the piezoelectric film from the two sides thereof.

The piezoelectric device of the present invention can have the larger coercive electric field than the conventional piezoelectric devices.

DESCRIPTION OF THE PREFERRED EMBODIMENTS

Figure 1:
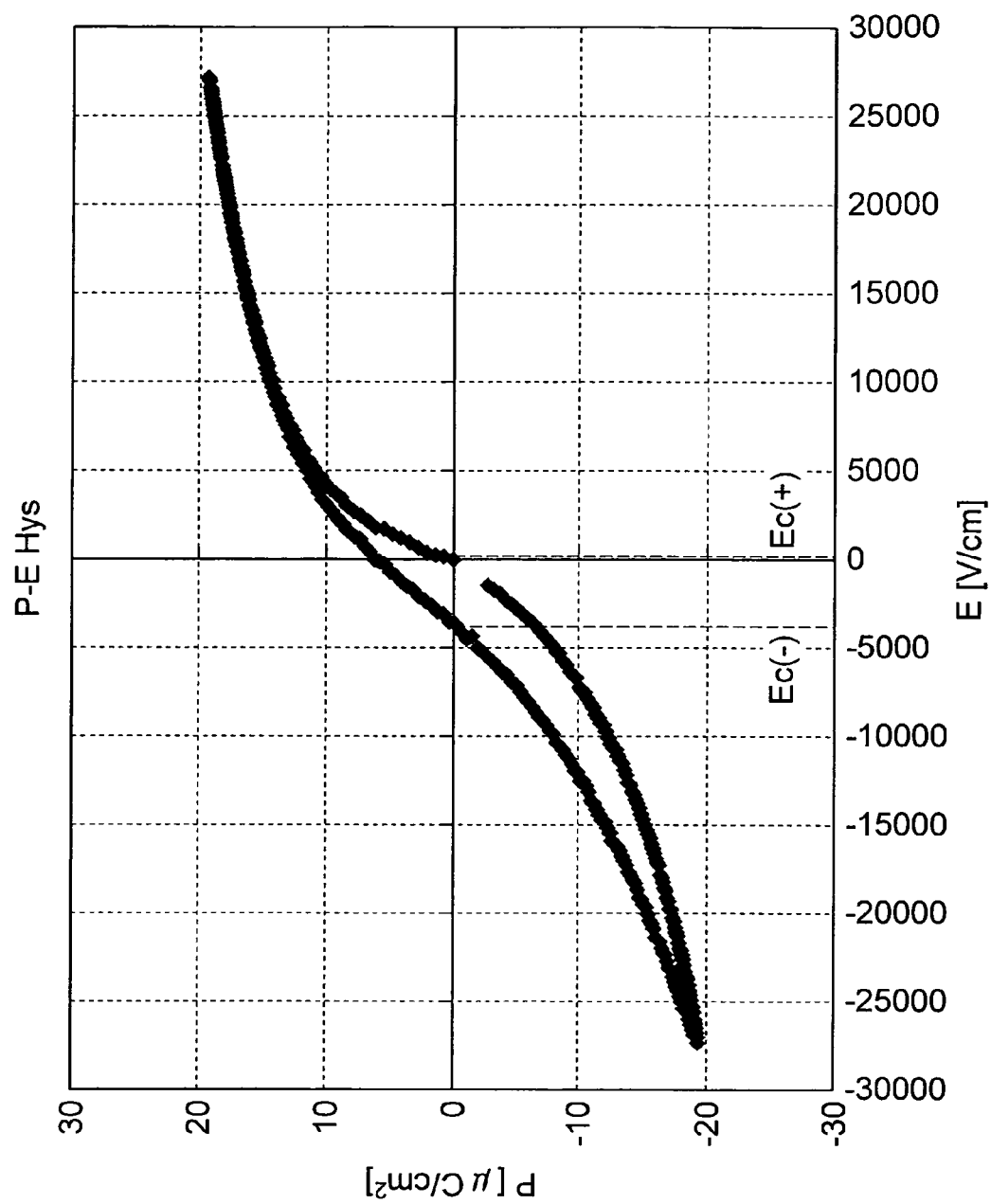
FIG. 1 is a drawing showing a hysteresis curve of polarization P-electric field E of a typical piezoelectric device, and positions of coercive electric field Ec.
Figure 2:
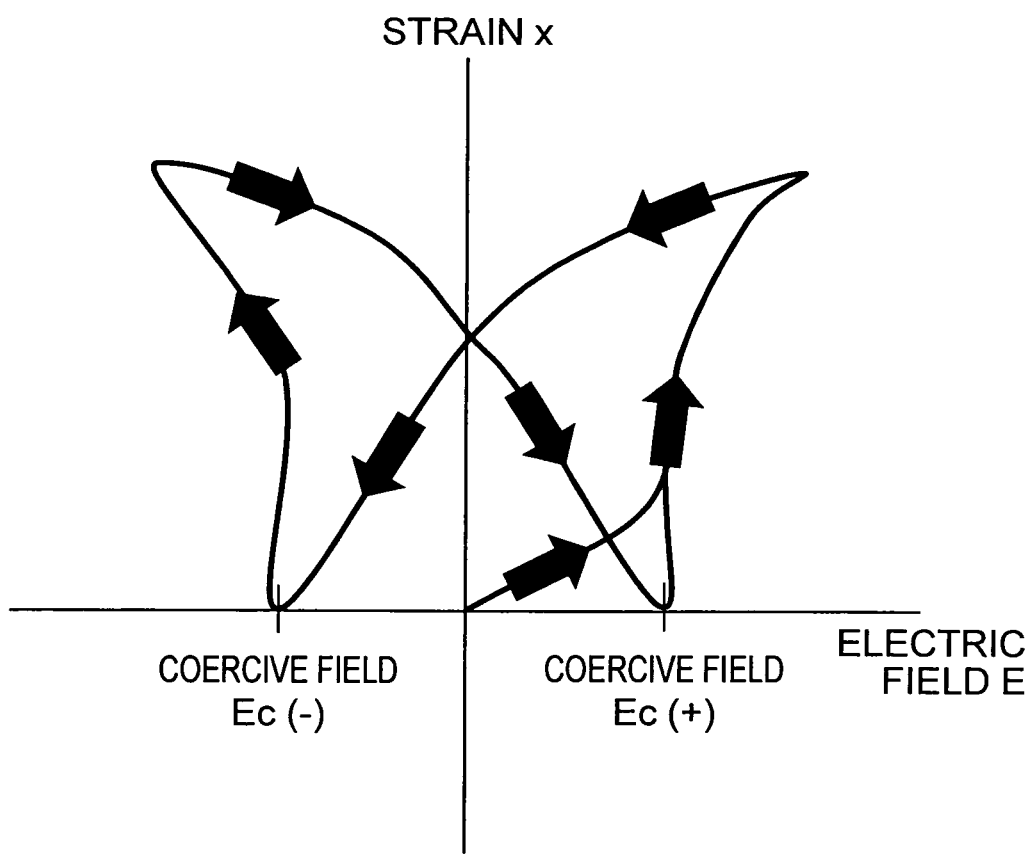
FIG. 2 is a drawing showing a relation of strain x and electric field E of a typical piezoelectric device (butterfly curve).

The preferred embodiments of the present invention will be described below in detail with reference to the drawings. In the drawings, identical or equivalent elements will be denoted by the same reference signs. The vertical and horizontal positional relations are as shown in the drawings. The description will be given without redundant description.

First Embodiment

Figure 3:
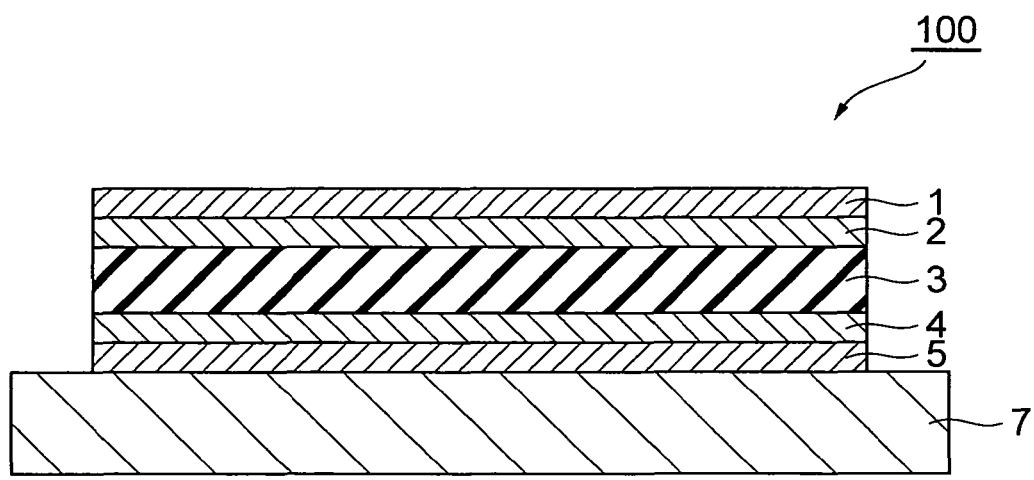
FIG. 3 is a configuration diagram of a piezoelectric device according to the first embodiment of the present invention.

FIG. 3 shows a piezoelectric device 100 according to the first embodiment of the present invention. The piezoelectric device 100 has a substrate 7, a first electrode film 5 laid on the substrate 7, a first electroconductive intermediate film 4 laid on the first electrode film 5, a piezoelectric film 3 laid on the first electroconductive intermediate film 4, a second electroconductive intermediate film 2 formed on the piezoelectric film 3, and a second electrode film 1 formed on the second electroconductive intermediate film 2.

(Substrate 7)

The substrate 7 is a plate serving as an underlying structure. The substrate 7 to be used herein can be, for example, a silicon substrate having the (100) plane orientation. The substrate 7 can have the thickness, for example, in the range of 10 μm to 1000 μm. The substrate 7 to be used herein can also be a silicon substrate having a plane orientation different from the (100) plane, a Silicon-on-Insulator (SOI) substrate, a quartz glass substrate, a compound semiconductor substrate composed of GaAs or the like, a sapphire substrate, a metal substrate composed of stainless steel or the like, a MgO substrate, or a $SrTiO_3$ substrate. An insulating film may be laid on the substrate 7 when the substrate 7 is an electroconductive material. The insulating film to be used herein can be, for example, a thermally oxidized silicon film ($SiO_2$), $Si_3N_4$, $ZrO_2$, $Y_2O_3$, ZnO, or $Al_2O_3$. The thickness of the insulating film can be in the range of 0.001 μm to 1.0 μm.

(First Electrode Film 5)

The first electrode film 5 is an electroconductive film. The first electrode film 5 is made, for example, of platinum (Pt). The first electrode film 5 preferably has the thickness in the range of 0.02 μm to 1.0 μm. When the thickness is less than 0.02 μm, the function as electrode can become insufficient; when the thickness is more than 1.0 μm, the displacement characteristic of the piezoelectric material can be hindered. The first electrode film 5 to be used herein can also be a metal material such as palladium (Pd), rhodium (Rh), gold (Au), ruthenium (Ru), or iridium (Ir).

(First Electroconductive Intermediate Film 4)

The first electroconductive intermediate film (first nonmetal electroconductive intermediate film) 4 is a nonmetal film. The linear expansion coefficient of the first electroconductive intermediate film 4 is larger than linear expansion coefficients of the first electrode film 5 and the piezoelectric film 3.

The linear expansion coefficient in the present specification is an average of change rates of length against temperature, per unit length in the range of 20° C. to 500° C. It is generally known that the linear expansion coefficient of a thin film is close to or slightly smaller than a value of a bulk material (e.g., cf. Non Patent Literature 1), and if we know types of respective materials forming the piezoelectric device, a magnitude relation of the linear expansion coefficients of the respective thin films can be adequately estimated.

The linear expansion coefficient of the first electroconductive intermediate film 4 is preferably larger by at least $0.1\times10^{-6}$ (1/K) than the larger value of the linear expansion coefficients of the first electrode film 5 and the piezoelectric film 3.

The thickness of the first electroconductive intermediate film 4 is preferably in the range of 10 nm to 100 nm. If the thickness is less than 10 nm, sufficient compressive stress may be unable to be exerted on the piezoelectric film 3; if the thickness is more than 100 nm, the crystallinity of the piezoelectric film 3 can degrade.

The first electroconductive intermediate film 4 is preferably an inorganic oxide film. Examples of inorganic oxides are electroconductive metal oxides. In the piezoelectric device 100 of the present embodiment, since a voltage is applied to the piezoelectric film 3 through the first electrode film 5 and the first electroconductive intermediate film 4, the first electroconductive intermediate film with too high specific resistance is not preferred. Therefore, the specific resistance of the first electroconductive intermediate film 4 is preferably not more than 0.1 Ωcm. For example, a $SrRuO_3$ film has the specific resistance of about $50\text{-}100\times10^{-6}$ Ωcm, a $SrTiO_3$ film the specific resistance of about $70\text{-}100\times10^{-6}$ Ωcm, and a $LaNiO_3$ film the specific resistance of about $300\text{-}400\times10^{-6}$ Ωcm; therefore, they are suitably applicable to the first electroconductive intermediate film 4. Besides, electroconductive metal oxide films such as $CaRuO_3$, $BaRuO_3$, $(La_xSr_{1-x})CoO_3$, $YBa_2Cu_3O_7$, and $La_4BaCu_5O_{13}$ also have the specific resistance of not more than 0.1 Ωcm, and thus are suitably applicable to the first electroconductive intermediate film 4. For the purpose of decreasing electroconductivity, an alkali metal element such as Li, K, or Na may be added to the first electroconductive intermediate film 4. Since deposition of the piezoelectric film 3 is carried out at high temperature as described below, metal materials with a low melting point are not suitable for the first electroconductive intermediate film 4.

(Piezoelectric Film 3)

There are no particular restrictions on a material of the piezoelectric film 3 as long as it exhibits the piezoelectric characteristics; examples of such materials for the piezoelectric film 3 include PZT (lead zirconate titanate), KNN (potassium sodium niobate), BT (barium titanate), LN (lithium niobate), BNT (bismuth sodium titanate), ZnO (zinc oxide), and AlN (aluminum nitride). There are no particular restrictions on the thickness of the piezoelectric film 3, but the thickness can be, for example, in the range of about 0.5 μm to 5 μm.

(Second Electroconductive Intermediate Film (Second Nonmetal Electroconductive Intermediate Film) 2)

The second electroconductive intermediate film 2 is a nonmetal film. The linear expansion coefficient of the second electroconductive intermediate film 2 is larger than those of the second electrode film 1 and the piezoelectric film 3. A material of the second electroconductive intermediate film 2 can be one of the materials listed for the first electroconductive intermediate film 4. The thickness of the second electroconductive intermediate film 2 can also be in the range described for the first electroconductive intermediate film 4.

The linear expansion coefficient of the second electroconductive intermediate film 2 is preferably larger by at least $0.1\times10^{-6}$ (1/K) than the larger value of the linear expansion coefficients of the second electrode film 1 and the piezoelectric film 3.

The second electroconductive intermediate film 2 and the first electroconductive intermediate film 4 can have the same composition. The thickness of the second electroconductive intermediate film 2 can be close to that of the first electroconductive intermediate film 4. In this case, it is easy to make the upper and lower stresses on the piezoelectric film 3 approximately equal. If there is a difference between the upper and lower stresses, the device can become warped.

(Second Electrode Film 1)

The second electrode film 1 is an electroconductive film and can be made, for example, of platinum (Pt). The second electrode film 1 can have the thickness, for example, in the range of 0.02 μm to 1.0 μm. The second electrode film 1 to be used herein is deposited by sputtering and can also be a metal material such as palladium (Pd), rhodium (Rh), gold (Au), ruthenium (Ru), or iridium (Ir). The thickness of the second electrode film 1 can be in the same range as that of the first electrode film 5.

(Stress on Film)

In the piezoelectric device 100, the first and second electroconductive intermediate films 4, 2 exert the compressive stress in directions along the surfaces of the piezoelectric film 3 in contact with the respective intermediate films 4, 2. As a result, the coercive electric field of the piezoelectric device 100 can be increased. There are no particular restrictions on the magnitude of the compressive stress on the piezoelectric film 3, but it can be, for example, in the range of 10 to 200 MPa. The increase of coercive electric field expands the range of drive voltage and thus provides a larger displacement.

(Manufacturing Method)

An example of a manufacturing method of the above-described piezoelectric device will be described below.

The first electrode film 5 is formed on the substrate 7, for example, by sputtering. For example, a Pt film is formed by sputtering on the silicon substrate 7 with the (100) plane orientation heated at about 400° C.-500° C., whereby the first electrode film 5 is obtained with high (100) orientation. This Pt film is favorable because it can enhance the orientation of the piezoelectric film 3 to be formed thereon thereafter. The first electrode film 5 may be formed by a method other than the foregoing.

Next, the first electroconductive intermediate film 4 is formed on the first electrode film 5. The first electroconductive intermediate film 4 can be formed by a method such as sputtering. The first electroconductive intermediate film 4 is preferably deposited at a temperature of not less than the Curie point of the piezoelectric film 3 because it affects the crystallinity of the piezoelectric film 3.

Next, the piezoelectric film 3 is deposited on the first electroconductive intermediate film 4. The piezoelectric film 3 is deposited by a method such as sputtering under a condition that the substrate 7 is heated at about 400° C.-600° C.

Subsequently, the second electroconductive intermediate film 2 is formed on the piezoelectric film 3. The second electroconductive intermediate film 2 is deposited by a method such as sputtering under a condition that the substrate 7 is heated at about 400° C.-600° C.

After the piezoelectric film 3 and the second electroconductive intermediate film 2 are deposited on the first electroconductive intermediate film 4 under the high temperature higher than room temperature in this manner, the first and second electroconductive intermediate films 2, 4 become more contracting than the piezoelectric film 3 according to the difference between their linear expansion coefficients in a process of returning the piezoelectric device to room temperature, so as to exert large compressive stress on the piezoelectric film 3.

Thereafter, the second electrode film 1 may be formed on the second electroconductive intermediate film 2 by a method such as sputtering. This completes the piezoelectric device 100.

Furthermore, the piezoelectric device 100 laid on the substrate 7 is then patterned by photolithography, if necessary, and the substrate 7 is further cut, whereby the piezoelectric device 100 can be obtained, for example, with a movable part in the size of 1 mm×2 mm.

Second Embodiment

A piezoelectric device 200 according to the second embodiment will be described with reference to FIG. 4. The piezoelectric device 200 of the present embodiment is different from the piezoelectric device 100 in that the substrate 7 as an underlying structure below the first electrode film 5 is removed. Because of this configuration, the top surface of the second electrode film 1 and the bottom surface of the first electrode film 5 are exposed to the outside. Since there are no restraints on expansion and compression by the substrate 7 in the piezoelectric device 200, the piezoelectric film 3 readily has much greater compressive stress. This enhances the effect of increase in coercive electric field. Since the device becomes lighter in weight by the weight of the substrate 7, the device can have a greater displacement. There are no specific restrictions on the magnitude of the compressive stress on the piezoelectric film 3, but it may be, for example, in the range of 20 to 400 MPa.

The piezoelectric device 200 of this configuration can be obtained, for example, as follows. First, the films 5-1 are deposited on the substrate 7 in the same manner as in the first embodiment. Next, a support substrate 7' preliminarily provided with a metal film 12 is bonded through a resin film 11 to the second electrode film 1. Then the substrate 7 is removed by etching. Thereafter, the films 5-1, 11, and 12 laid on the support substrate 7' are patterned in a desired shape, e.g., by photolithography. Finally, the support substrate 7', resin film 11, and metal film 12 are removed by etching.

Third Embodiment

A piezoelectric device 300 according to the third embodiment will be described with reference to FIG. 5. The piezoelectric device 300 of the present embodiment is different from the piezoelectric device 100 in that the substrate 7 as an underlying structure below the first electrode film 5 is removed and in that a resin film 11 is provided on the second electrode film 1 so as to be in contact with the second electrode film 1. The films 1-5 are supported by the resin film 11 with lower rigidity, instead of the substrate 7 with high rigidity, which reduces stress exerted on the films 1-5 by the substrate 7, so as to allow greater compressive stress to be introduced to the piezoelectric film 3 from the first and second electroconductive intermediate films 2, 4, thereby enhancing the effect of increase in coercive electric field. Furthermore, the piezoelectric film 3 becomes less likely to be hindered from displacement by the substrate 7, which results in achieving more adequate displacement. There are no specific restrictions on the magnitude of the compressive stress on the piezoelectric film 3, but it can be, for example, in the range of 20 to 400 MPa.

The resin film 11 can be made, for example of an epoxy resin, a polyimide resin, or the like. A coating thickness of the resin film can be in the range of about 5 μm to 15 μm.

Figure 5:
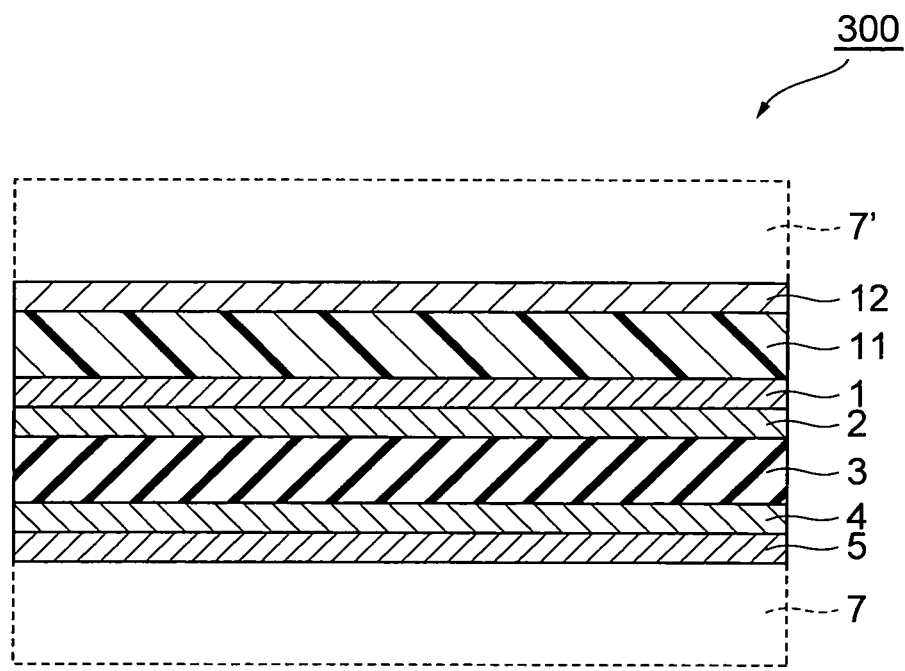
FIG. 5 is a configuration diagram of a piezoelectric device according to the third embodiment of the present invention.

Furthermore, as shown in FIG. 5, the device may have a metal film 12 on the resin film 11. A material of the metal film 12 can be the same as the material of the second electrode film 1 and can be, for example, a metal material such as Pt, Ni, Pd, In, Rh, or Au. The thickness of the metal film 12 can be in the range of 0.02 μm to 1.0 μm.

The piezoelectric device 300 of this configuration can be obtained as follows. First, the films 5-1 are deposited on the substrate 7 in the same manner as in the first embodiment. Next, the support substrate 7' preliminarily provided with the metal film 12 is bonded through the resin film 11 to the second electrode film 1. Then the substrate 7 is removed by etching. Thereafter, the films 5-1, 11, and 12 laid on the support substrate 7' are patterned in a desired shape, e.g., by photolithography. Finally, the support substrate 7' is removed by etching. The metal film 12 may be left without being removed.

For example, the piezoelectric device of the present invention is suitably applied to the piezoelectric devices making use of the piezoelectric effect, such as gyro sensors, shock sensors, and microphones, or to the piezoelectric devices making use of the inverse piezoelectric effect, such as actuators, ink jet heads, speakers, buzzers, and resonators, and it is particularly suitably applied to the piezoelectric devices making use of the inverse piezoelectric effect.

EXAMPLES

The present invention will be described below in more detail on the basis of examples and a comparative example, but it should be noted that the present invention is by no means limited to the examples below.

Example 1

The piezoelectric device 100 of Example 1 according to the first embodiment of the present invention as shown in FIG. 3 was manufactured through the steps as described below.

The silicon substrate 7 with the (100) plane orientation was heated at 400° C. and a 200 nm Pt film was formed as the first electrode film 5 on the silicon substrate 7 by sputtering. Then the silicon substrate 7 was heated to 550° C. and a 15 nm SrRuO$_3$ film was formed as the electroconductive intermediate film 4 on the Pt film by sputtering. Next, while the silicon substrate 7 was kept heated at 550° C., a 2000 nm potassium sodium niobate (KNN) film was formed as the piezoelectric film 3 on the SrRuO$_3$ film by sputtering. Subsequently, a 15 nm BaRuO$_3$ film was formed as the electroconductive intermediate film 2 on the potassium sodium niobate film by sputtering. Next, at room temperature a 200 nm Pt film was formed as the second electrode film 1 on the BaRuO$_3$ film by sputtering.

Thereafter, the laminated films on the silicon substrate 7 were patterned by photolithography and singulation was further performed to manufacture the piezoelectric device 100 with the size of movable part of 1 mm×2 mm.

Besides the above, potassium sodium niobate (KNN), SrRuO$_3$, BaRuO$_3$, and Pt films were individually formed under the same conditions as above, on the silicon substrate 7, and the linear expansion coefficients of the respective films were measured by the X-ray reflectivity technique. The resistivity (specific resistance) was also measured for each of the electroconductive intermediate films. The measurement results are provided below.

KNN: $8.0 \times 10^{-6}$ 1/K
SrRuO$_3$: $10.3 \times 10^{-6}$ 1/K, $5.0 \times 10^{-5}$ Ωcm
BaRuO$_3$: $9.8 \times 10^{-6}$ 1/K, $8.0 \times 10^{-5}$ Ωcm
Pt: $8.8 \times 10^{-6}$ 1/K Furthermore, the linear expansion coefficient of the silicon substrate 7 is the value below.

Si: $2.6 \times 10^{-6}$ 1/K

Examples 2 to 14

The piezoelectric devices 100 of Examples 2 to 14 were obtained in the same manner as in Example 1, except that the devices 100 were manufactured using the piezoelectric film 3 and the electroconductive intermediate films 2, 4 made of the materials provided in Tables 2 and 3. The results of measurement of the linear expansion coefficients and resistivities of the respective materials are also provided in Tables 1 to 3.

Examples 15 and 16

Figure 4:
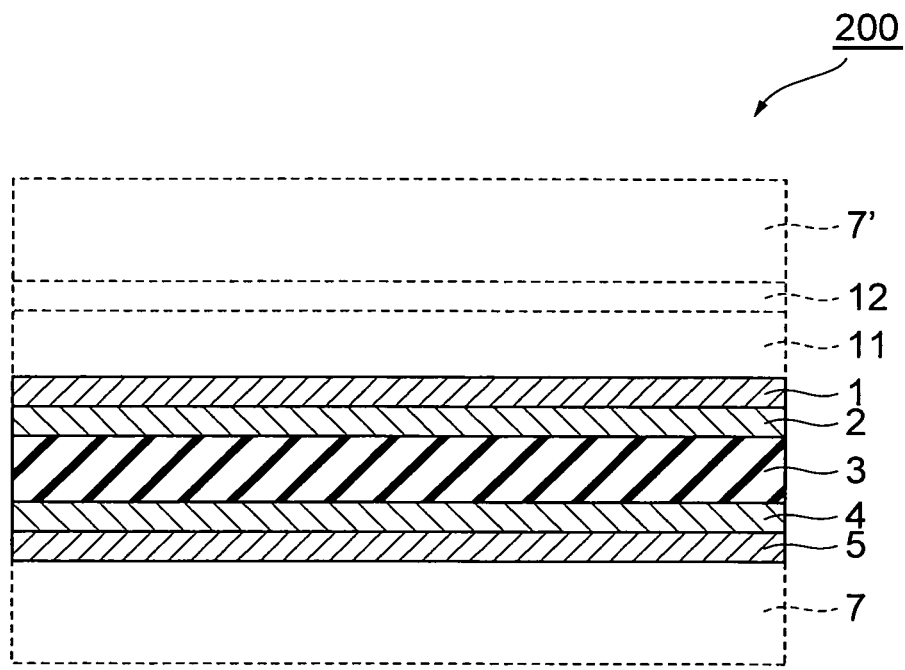
FIG. 4 is a configuration diagram of a piezoelectric device according to the second embodiment of the present invention.

The piezoelectric devices 200 of Examples 15 and 16 according to the second embodiment of the present invention as shown in FIG. 4 were manufactured through the steps as described below.

The films 5-1 were deposited on the silicon substrate 7 by sputtering in the same manner as in Example 1. Thereafter, the support substrate 7' having the metal film 12 was bonded through the resin film 11 of epoxy resin to the second electrode film 1. Then the silicon substrate 7 was removed by an etching process of RIE. The laminated films on the support substrate 7' were patterned by photolithography to obtain the piezoelectric device part with the size of movable part of 1 mm×2 mm, and the support substrate 7', resin film 11, and metal film 12 were removed to obtain the rectangular piezoelectric device 200.

Comparative Example 1

Figure 6:
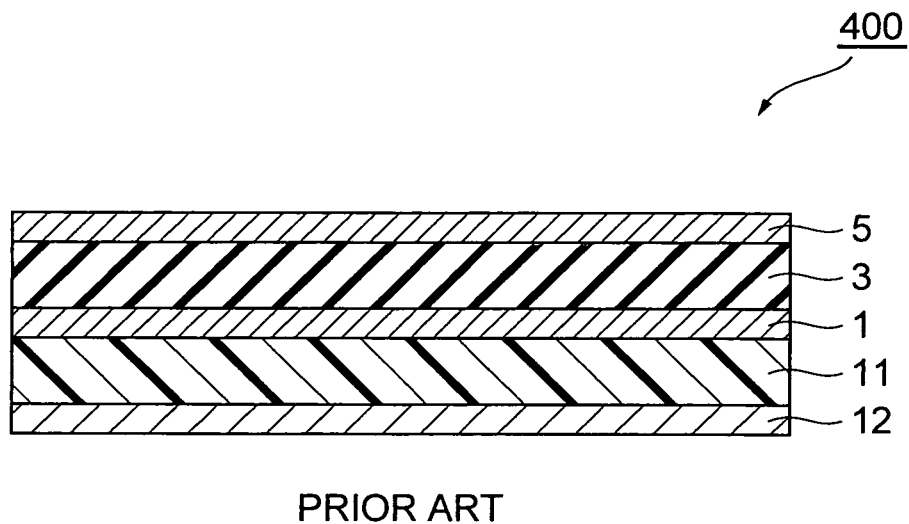
FIG. 6 is a drawing showing a film configuration of a piezoelectric device of Comparative Example 1.

A piezoelectric device 400 of Comparative Example 1 was obtained in the same manner as in Example 1, except that the device was constructed without the electroconductive intermediate films 2 and 4 (cf. FIG. 6).

(Evaluation)

The coercive electric fields were obtained by measuring P-E hysteresis curves by a ferroelectric evaluation system TF-1000 available from Aixacct. Displacements and coercive electric fields with application of voltage to the respective piezoelectric devices were measured using a laser Doppler vibrometer (available from GRAPHTEC corporation).

The coercive electric fields Ec and Vc were obtained from the P-E hysteresis curves measured by connecting the first electrode film to the positive electrode and the second electrode film to the negative electrode and applying a triangular wave of ±27 kV/cm with the frequency of 120 Hz. Values of displacements were measured similarly by connecting the first electrode film to the positive electrode and the second electrode film to the negative electrode and applying a voltage of a sine wave (±10 V) with the frequency of 120 Hz. The results of these are provided in Table 4.

It was confirmed that the coercive electric fields Ec+, Vc+ and the coercive electric fields Ec−, Vc− of the piezoelectric devices of Examples 1 to 16 with the first nonmetal electroconductive intermediate film having the linear expansion coefficient larger than those of the first electrode film and the piezoelectric film and with the second nonmetal electroconductive intermediate film having the linear expansion coefficient larger than those of the second electrode film and the piezoelectric film were larger than the coercive electric fields Ec+, Vc+ and the coercive electric fields Ec−, Vc− of Comparative Example 1 without the first and second nonmetal electroconductive intermediate films.

TABLE 1

| | Substrate | | 1st electrode film | | |
|---|---|---|---|---|---|
| | material | LEC $10^{-6}$ 1/K | material | T nm | LEC $10^{-6}$ 1/K |
| C Ex 1 | Si (100) | 2.6 | Pt | 200 | 8.8 |
| Ex 1 | Si (100) | 2.6 | Pt | 200 | 8.8 |
| Ex 2 | Si (100) | 2.6 | Pt | 200 | 8.8 |
| Ex 3 | Si (100) | 2.6 | Pt | 200 | 8.8 |
| Ex 4 | Si (100) | 2.6 | Pt | 200 | 8.8 |
| Ex 5 | Si (100) | 2.6 | Pt | 200 | 8.8 |
| Ex 6 | Si (100) | 2.6 | Pt | 200 | 8.8 |
| Ex 7 | Si (100) | 2.6 | Pt | 200 | 8.8 |
| Ex 8 | Si (100) | 2.6 | Pt | 200 | 8.8 |
| Ex 9 | Si (100) | 2.6 | Pt | 200 | 8.8 |
| Ex 10 | Si (100) | 2.6 | Pt | 200 | 8.8 |
| Ex 11 | Si (100) | 2.6 | Pt | 200 | 8.8 |
| Ex 12 | Si (100) | 2.6 | Pt | 200 | 8.8 |
| Ex 13 | Si (100) | 2.6 | Pt | 200 | 8.8 |
| Ex 14 | Si (100) | 2.6 | Pt | 200 | 8.8 |
| Ex 15 | no | — | Pt | 200 | 8.8 |
| Ex 16 | no | — | Pt | 200 | 8.8 |

Ex: Example; C Ex: Comparative Example; LEC: linear expansion coefficient; T: thickness

TABLE 2

| | 1st conductive intermediate film | | | | piezoelectric film | | |
|---|---|---|---|---|---|---|---|
| | material | T nm | LEC $10^{-6}$ 1/K | resistivity $\Omega$cm | material | T nm | LEC $10^{-6}$ 1/K |
| C Ex 1 | no | 0 | 0.0 | — | (K, Na)NbO$_3$ | 2000 | 8.0 |
| Ex 1 | SrRuO$_3$ | 15 | 10.3 | 5.0E−05 | (K, Na)NbO$_3$ | 2000 | 8.0 |
| Ex 2 | SrRuO$_3$ | 15 | 10.3 | 5.0E−05 | (K, Na)NbO$_3$ | 2000 | 8.0 |
| Ex 3 | SrTiO$_3$ | 15 | 11.1 | 7.0E−05 | (K, Na)NbO$_3$ | 2000 | 8.0 |
| Ex 4 | LaNiO$_3$ | 15 | 9.7 | 4.0E−04 | (K, Na)NbO$_3$ | 2000 | 8.0 |
| Ex 5 | CaRuO$_3$ | 15 | 10.1 | 5.5E−05 | (K, Na)NbO$_3$ | 2000 | 8.0 |
| Ex 6 | BaRuO$_3$ | 15 | 9.8 | 8.0E−05 | (K, Na)NbO$_3$ | 2000 | 8.0 |
| Ex 7 | La$_{0.5}$Sr$_{0.5}$CoO$_3$ | 15 | 18.0 | 9.0E−04 | (K, Na)NbO$_3$ | 2000 | 8.0 |
| Ex 8 | La$_4$BaCu$_5$O$_{13}$ | 15 | 17.8 | 1.0E−03 | (K, Na)NbO$_3$ | 2000 | 8.0 |
| Ex 9 | Sr(Ru$_{0.95}$,Mn$_{0.05}$)O$_3$ | 15 | 12.0 | 9.0E−05 | (K, Na)NbO$_3$ | 2000 | 8.0 |
| Ex 10 | YBa$_2$Cu$_3$O$_7$ | 15 | 13.4 | 2.3E−04 | (K, Na)NbO$_3$ | 2000 | 8.0 |
| Ex 11 | SrRuO$_3$: K | 15 | 10.1 | 4.2E−05 | (K, Na)NbO$_3$ | 2000 | 8.0 |
| Ex 12 | SrRuO$_3$: Na | 15 | 10.0 | 4.0E−05 | (K, Na)NbO$_3$ | 2000 | 8.0 |
| Ex 13 | SrRuO$_3$ | 15 | 10.3 | 5.0E−05 | Pb(Zr, Ti)O$_3$ | 2000 | 5.3 |
| Ex 14 | YBa$_2$Cu$_3$O$_7$ | 15 | 13.4 | 2.3E−04 | BaTiO$_3$ | 2000 | 12.5 |

TABLE 2-continued

| | 1st conductive intermediate film | | | | piezoelectric film | | |
|---|---|---|---|---|---|---|---|
| | material | T nm | LEC 10⁻⁶ 1/K | resistivity Ωcm | material | T nm | LEC 10⁻⁶ 1/K |
| Ex 15 | SrRuO$_3$ | 15 | 10.3 | 5.0E−05 | (K, Na)NbO$_3$ | 2000 | 8.0 |
| Ex 16 | SrRuO$_3$: Na | 15 | 10.0 | 4.2E−05 | (K, Na)NbO$_3$ | 2000 | 8.0 |

Ex: Example;
C Ex: Comparative Example;
LEC: linear expansion coefficient;
T: thickness

TABLE 3

| | 2nd conductive intermediate film | | | | 2nd electrode film | | |
|---|---|---|---|---|---|---|---|
| | material | T nm | LES 10⁻⁶ 1/K | resistivity Ωcm | material | T nm | LEC 10⁻⁶ 1/K |
| C Ex 1 | no | — | — | — | Pt | 200 | 8.8 |
| Ex 1 | BaRuO$_3$ | 15 | 9.8 | 8.0E−05 | Pt | 200 | 8.8 |
| Ex 2 | SrRuO$_3$ | 15 | 10.3 | 5.0E−05 | Pt | 200 | 8.8 |
| Ex 3 | SrTiO$_3$ | 15 | 11.1 | 7.0E−05 | Pt | 200 | 8.8 |
| Ex 4 | LaNiO$_3$ | 15 | 9.7 | 4.0E−04 | Pt | 200 | 8.8 |
| Ex 5 | CaRuO$_3$ | 15 | 10.1 | 5.5E−05 | Pt | 200 | 8.8 |
| Ex 6 | BaRuO$_3$ | 15 | 9.8 | 8.0E−05 | Pt | 200 | 8.8 |
| Ex 7 | La$_{0.5}$Sr$_{0.5}$CoO$_3$ | 15 | 18.0 | 9.0E−04 | Pt | 200 | 8.8 |
| Ex 8 | La$_4$BaCu$_5$O$_{13}$ | 15 | 17.8 | 1.0E−03 | Pt | 200 | 8.8 |
| Ex 9 | Sr(Ru$_{0.95}$,Mn$_{0.05}$)O$_3$ | 15 | 12.0 | 9.0E−05 | Pt | 200 | 8.8 |
| Ex 10 | YBa$_2$Cu$_3$O$_7$ | 15 | 13.4 | 2.3E−04 | Pt | 200 | 8.8 |
| Ex 11 | SrRuO$_3$: K | 15 | 10.1 | 4.2E−05 | Pt | 200 | 8.8 |
| Ex 12 | SrRuO$_3$: Na | 15 | 10.0 | 4.0E−05 | Pt | 200 | 8.8 |
| Ex 13 | SrRuO$_3$ | 15 | 10.3 | 5.0E−05 | Pt | 200 | 8.8 |
| Ex 14 | YBa$_2$Cu$_3$O$_7$ | 15 | 13.4 | 2.3E−04 | Pt | 200 | 8.8 |
| Ex 15 | SrRuO$_3$ | 15 | 10.3 | 5.0E−05 | Pt | 200 | 8.8 |
| Ex 16 | SrRuO$_3$: Na | 15 | 10.0 | 4.2E−05 | Pt | 200 | 8.8 |

Ex: Example;
C Ex: Comparative Example;
LEC: linear expansion coefficient;
T: thickness

TABLE 4

| | CEF Ec+ (kV/cm) | CEF Ec− (kV/cm) | CEF Vc+ (V) | CEF Vc− (V) | D (μm) @sine wave ± 10 V |
|---|---|---|---|---|---|
| C Ex 1 | 8.9 | −37.9 | 1.78 | −7.58 | 0.12 |
| Ex 1 | 10.2 | −75.0 | 2.04 | −15.00 | 1.50 |
| Ex 2 | 11.9 | −83.2 | 2.38 | −16.64 | 1.60 |
| Ex 3 | 11.3 | −68.9 | 2.26 | −13.78 | 1.24 |
| Ex 4 | 12.5 | −72.0 | 2.50 | −14.40 | 0.95 |
| Ex 5 | 11.5 | −79.9 | 2.30 | −15.98 | 1.49 |
| Ex 6 | 10.0 | −64.2 | 2.00 | −12.84 | 1.13 |
| Ex 7 | 14.0 | −93.5 | 2.80 | −18.70 | 0.88 |
| Ex 8 | 13.8 | −92.5 | 2.76 | −18.50 | 0.70 |
| Ex 9 | 12.8 | −71.0 | 2.56 | −14.20 | 1.05 |
| Ex 10 | 13.1 | −88.3 | 2.62 | −17.66 | 1.00 |
| Ex 11 | 12.0 | −85.0 | 2.40 | −17.00 | 2.05 |
| Ex 12 | 12.3 | −86.0 | 2.46 | −17.20 | 2.11 |
| Ex 13 | 14.0 | −100.1 | 2.80 | −20.02 | 2.10 |
| Ex 14 | 13.0 | −78.0 | 2.60 | −15.60 | 0.88 |
| Ex 15 | 17.8 | −110.4 | 3.56 | −22.08 | 5.66 |
| Ex 16 | 18.0 | −111.5 | 3.60 | −22.30 | 6.12 |

Ex: Example; C Ex: Comparative Example; CEF: coercive electric field; D: displacement

What is claimed is:

1. A piezoelectric device comprising:
a first electrode film;
a first nonmetal electroconductive intermediate film provided on the first electrode film;
a piezoelectric film provided on the first nonmetal electroconductive intermediate film;
a second nonmetal electroconductive intermediate film provided on the piezoelectric film; and
a second electrode film provided on the second nonmetal electroconductive intermediate film,
wherein a linear expansion coefficient of the first nonmetal electroconductive intermediate film is larger than a linear expansion coefficient of the first electrode film and a linear expansion coefficient of the piezoelectric film,
wherein a linear expansion coefficient of the second nonmetal electroconductive intermediate film is larger than a linear expansion coefficient of the second electrode film and the linear expansion coefficient of the piezoelectric film, and
wherein there is no substrate 10 μm or more thick on a top surface of the second electrode film and there is no substrate 10 μm or more thick on a bottom surface of the first electrode film, either.

2. The piezoelectric device according to claim 1, wherein the first and second nonmetal electroconductive intermediate films are in direct contact with the piezoelectric film.

3. The piezoelectric device according to claim 1, wherein the first and second nonmetal electroconductive intermediate films are inorganic oxide films respectively.

4. The piezoelectric device according to claim 3, wherein the two inorganic oxide films have the same composition.

* * * * *